United States Patent
in 't Zandt et al.

(10) Patent No.: US 9,236,734 B2
(45) Date of Patent: Jan. 12, 2016

(54) ELECTRIC FIELD GAP DEVICE AND MANUFACTURING METHOD

(71) Applicant: NXP B.V., Eindhoven (NL)

(72) Inventors: Michael in 't Zandt, Veldhoven (NL); Klaus Reimann, Eindhoven (NL); Olaf Wunnicke, Eindhoven (NL)

(73) Assignee: NXP B.V., Eindhoven (NL)

( * ) Notice: Subject to any disclaimer, the term of this patent is extended or adjusted under 35 U.S.C. 154(b) by 73 days.

(21) Appl. No.: 14/301,445

(22) Filed: Jun. 11, 2014

(65) Prior Publication Data

US 2015/0002966 A1    Jan. 1, 2015

(30) Foreign Application Priority Data

Jun. 26, 2013    (EP) ..................... 13173868

(51) Int. Cl.
| | |
|---|---|
| *H02H 9/00* | (2006.01) |
| *H02H 9/06* | (2006.01) |
| *H01L 23/60* | (2006.01) |
| *H01L 27/02* | (2006.01) |
| *H01J 9/02* | (2006.01) |
| *H01J 9/18* | (2006.01) |

(52) U.S. Cl.
CPC ........... *H02H 9/06* (2013.01); *H01J 9/025* (2013.01); *H01J 9/18* (2013.01); *H01L 23/60* (2013.01); *H01L 27/0288* (2013.01); *H01L 2924/0002* (2013.01)

(58) Field of Classification Search
CPC .................................. H02H 9/04; H02H 9/046
USPC ............................................................ 361/56
See application file for complete search history.

(56) References Cited

U.S. PATENT DOCUMENTS

| | | | |
|---|---|---|---|
| 5,136,764 A | 8/1992 | Vasquez | |
| 5,249,340 A | 10/1993 | Kane et al. | |
| 5,357,397 A * | 10/1994 | Leary | ...................... H01L 23/60 |
| | | | 361/220 |
| 5,990,519 A | 11/1999 | Huang-Lu et al. | |
| 2006/0092595 A1 * | 5/2006 | Hwa Lee | ............... H01G 2/065 |
| | | | 361/306.3 |
| 2006/0284278 A1 * | 12/2006 | Min | ........................ H01L 21/84 |
| | | | 257/506 |
| 2013/0113102 A1 * | 5/2013 | Bao | ................... H01L 21/76846 |
| | | | 257/751 |

OTHER PUBLICATIONS

Ulisse, G., et al; "Cross-Bar Design of Nano-Vacuum Triode for High-Frequency Applications"; IEEE Electron Device Letters, vol. 33, No. 9; 3 pages (Sep. 2012).

Extended European Search Report for Application No. 13173868.4 (Nov. 29, 2013).

* cited by examiner

*Primary Examiner* — Dharti Patel

(57) ABSTRACT

The invention provides a method of forming an electric field gap device, such as a lateral field emission ESD protection structure, in which a cathode layer is formed between dielectric layers. Anode channels are formed and they are lined with a sacrificial dielectric layer. Conductive anode pillars are formed in the anode channels, and then the sacrificial dielectric layer is etched away in the vicinity of the anode pillars. The etching leaves a suspended portion of the cathode layer which defines a lateral gap to an adjacent anode pillar. This portion has a sharp end face defined by the corners of the cathode layer and the lateral gap can be defined accurately as it corresponds to the thickness of the sacrificial dielectric layer.

15 Claims, 5 Drawing Sheets

ELECTRIC FIELD GAP DEVICE AND MANUFACTURING METHOD

CROSS-REFERENCE TO RELATED APPLICATIONS

This application claims the priority under 35 U.S.C. §119 of European patent application no. 13173868.4, filed on Jun. 26, 2013, the contents of which are incorporated by reference herein.

This invention relates to electric field gap devices, by which is meant devices that make use of a small gap between a cathode and an anode, across which an electric field is established.

Electrostatic discharge (ESD) protection devices are one example of such devices. These devices are used for protecting integrated circuits from damage caused by electrostatic discharge. The voltage in a discharge event can reach thousands of volts, whereas circuit components may need to be protected to prevent voltages exceeding for example 10V.

Many ESD protection devices are available, such as a coil and capacitance coupled to ground, or dedicated components like spark-gaps or varistors. The drawback of many of these devices is that there is a trade-off between a low and constant capacitance and a low overshoot voltage.

For some applications (e.g. antennas), a combination of both a constant capacitance and a relatively low overshoot voltage is required.

A way to overcome a non-linear capacitance and a high overshoot voltage is by use of field emission. This approach makes use of a pair of spaced metal points which serve to initiate a field emission discharge.

The structure requires two electrodes with a relatively narrow gap in between (e.g. 50 nm) to allow electrons to travel from one electrode to the other, and possibly also with the requirement of not creating a spark. A spark might nevertheless be formed for strong discharge events. A narrow gap also enables low overshoot voltage.

An example of field emission ESD protection devices is disclosed in U.S. Pat. No. 5,933,718. This is aimed at improving the reliability of forming a specific gap size using the same structure as used for a gate stack.

The invention aims to provide an improved process and structure for providing a lateral electric field gap device.

The invention is defined by the claims.

According to the invention, there is provided a method of forming an electrical field gap structure, comprising:
  forming a first dielectric layer over a substrate;
  forming a cathode layer over the first dielectric layer;
  forming a second dielectric layer over the cathode layer;
  etching anode channels through the second dielectric layer and the cathode layer and into the first dielectric layer;
  lining the resulting surface with a third dielectric layer;
  forming conductive anode pillars in the anode channels;
  etching away the third dielectric layer and the second dielectric layer in the vicinity of the anode pillars, and at least partially etching away the first dielectric layer in the vicinity of the anode pillars, thereby to leave a suspended portion of the cathode layer which defines a lateral gap to an adjacent anode pillar.

This method forms channels through a cathode layer to define edges of that layer. The edge is subsequently lined to define a desired spacing. When this lining is eventually etched away, the desired spacing gap is formed, and suspended cathode layer portions are formed. These cathode layer portions project laterally, and they are formed by a sacrificial etch process so that no coverage issues arise, in that the projecting portions are not covered at any stage in the process. The projecting portions are sharp as a result of the corners of the projecting cathode layer. In particular, a sacrificial etch process removes material above and below to define the projecting portions, as well as forming the desired gap.

The electrical field gap structure can be an ESD protection structure. The projecting layer defines the cathode. Two similar structures, with opposite polarity, can be connected to a circuit that needs to be protected. so that protection can be provided for ESD events of both polarities. The anode pillars provide thick layers with good heat conductivity, which are used to transport the heat induced by the electrostatic discharge The method can further comprise forming connection pillars through the first dielectric layer to the substrate, and wherein the cathode layer is formed over the first dielectric layer and the connection pillars. This means that electrical connection to the cathode layer is brought down to the substrate or an underlying circuit.

The method can further comprise forming a packaging layer over the anode pillars. This can be used to form a sealed structure. The structure can be sealed with a reduced pressure (e.g. a vacuum) to prevent sparking across the gap. However, the structure can instead be used as a spark gap device.

The first, second and third dielectric layers can each comprise silicon dioxide or silicon nitride, and they may all be the same material. This makes the etching process more controllable. In particular, all three layers are subjected to full or partial etching to define the suspended cathode portions and the cathode-anode gap.

The connection pillars can comprise a stack of one or more of titanium, titanium nitride and tungsten and alloys containing these materials.

Preferably, the anode channels extend only partially into the first dielectric layer. This means a portion of the first dielectric layer can remain beneath the anodes, and this can be selected to provide a desired capacitance between the anode and the substrate.

The thickness of third dielectric layer is selected to correspond to the desired anode-cathode gap. This means the gap dimension can be tuned accurately, since it corresponds to a deposited layer thickness.

The material of the anode pillars can also be used to form an anode contact over the third dielectric layer outside the region where the anode pillars are formed.

In one example, the lateral field emission ESD protection structure is formed over an integrated circuit, and the connection pillars connect to a metal layer within the integrated circuit. This metal layer can be the top metal interconnect layer of the integrated circuit beneath. By providing the structure over an integrated circuit, for example over a CMOS integrated circuit, the layers used can be tailored to the specific requirements of the ESD protection, but they can also be fully integrated with the circuit to be protected.

The invention also provides an electric field gap structure, comprising:
  a first dielectric layer over a substrate;
  a cathode layer over the first dielectric layer which defines cathode portions which have an edge region with a portion of the first dielectric layer beneath under-etched away thereby to define laterally projecting edge regions;
  conductive anode pillars which extend into the first dielectric layer, wherein a lateral spacing is defined between each laterally projecting edge region and an adjacent anode pillar;
  a second dielectric layer over the cathode layer, wherein the second dielectric layer is absent over the edge regions; and a third dielectric layer over the second dielectric layer, wherein the thickness of the third dielectric layer corresponds to the lateral spacing.

This structure forms the lateral spacing based on the thickness of a sacrificial third dielectric layer.

The structure can be a lateral field emission ESD protection structure, The invention then provides an ESD protection device and a fabrication technique, in which a relatively sharp cathode structure can be formed. This sharp cathode structure is used to enhance locally the electric field at the electrode surface.

The device can be processed on a blanket silicon substrate as a discrete ESD protection device, or as an addition on top of an integrated circuit that is already processed on the wafer, as mentioned above. By vacuum sealing the gap, sparking can be prevented. The device can instead deliberately be used as spark-gap device.

BRIEF DESCRIPTION OF DRAWINGS

An example of the invention will now be described in detail with reference to the accompanying drawings, in which.

The invention provides a method of forming a structure, in which a cathode layer is formed between dielectric layers. Anode channels are formed and they are lined with a sacrificial dielectric layer. Conductive anode pillars are formed in the anode channels, and then the sacrificial dielectric layer is etched away in the vicinity of the anode pillars. The etching leaves a suspended portion of the cathode layer which defines a lateral gap to an adjacent anode pillar. This portion has a sharp end face and the lateral gap can be defined accurately as it corresponds to the thickness of the sacrificial dielectric layer.

Figure 7:
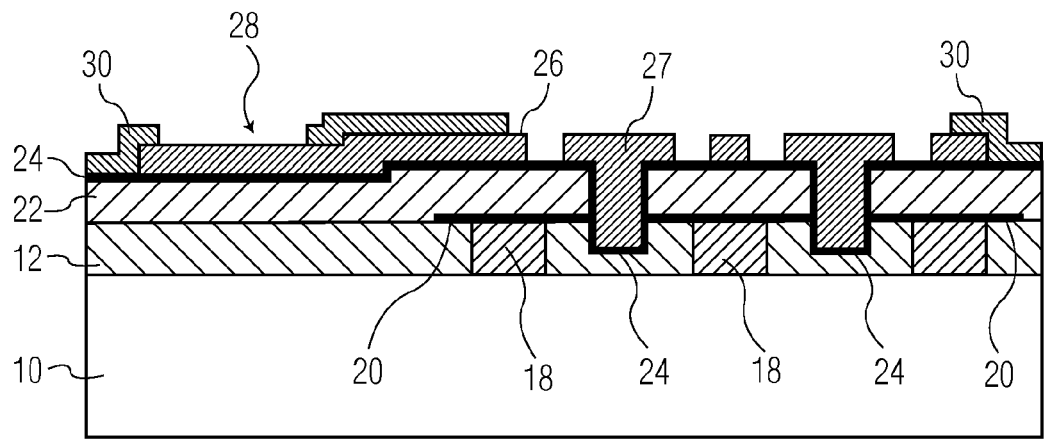
FIG. 7 is one example of a sixth stage in the process.
Figure 8:
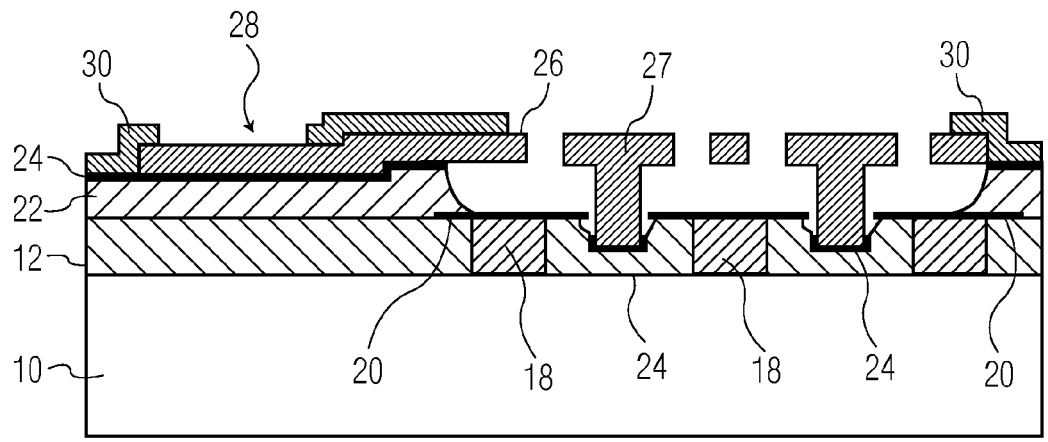
FIG. 8 is one example of a seventh stage in the process.
Figure 9:
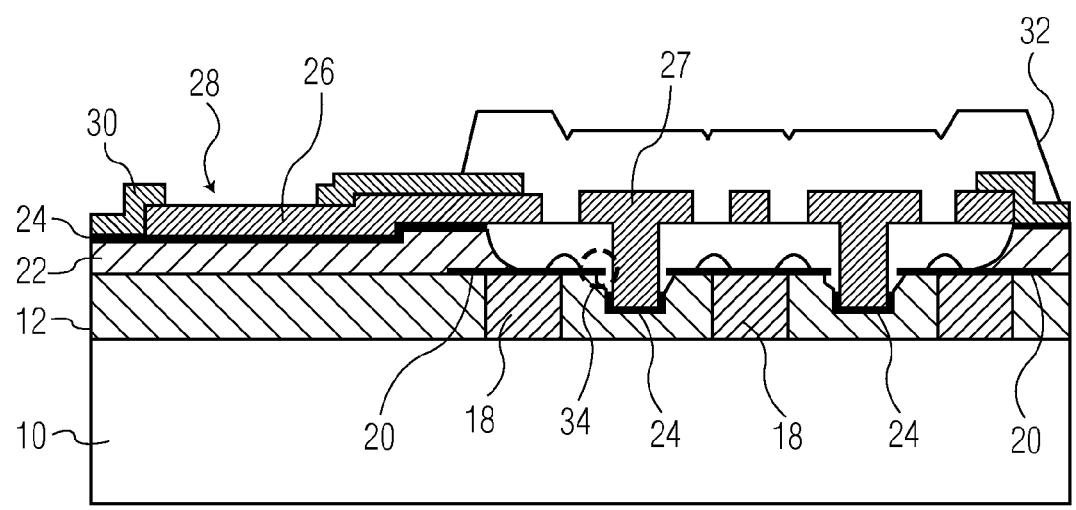
FIG. 9 shows the final device in accordance with the invention.

The various stages in the process used to manufacture an example of device of the invention will be described with reference to FIGS. 1 to 9, in which FIG. 9 shows the final device. It is noted that the dimensions and thicknesses shown in the drawings are not to scale.

Figure 1:
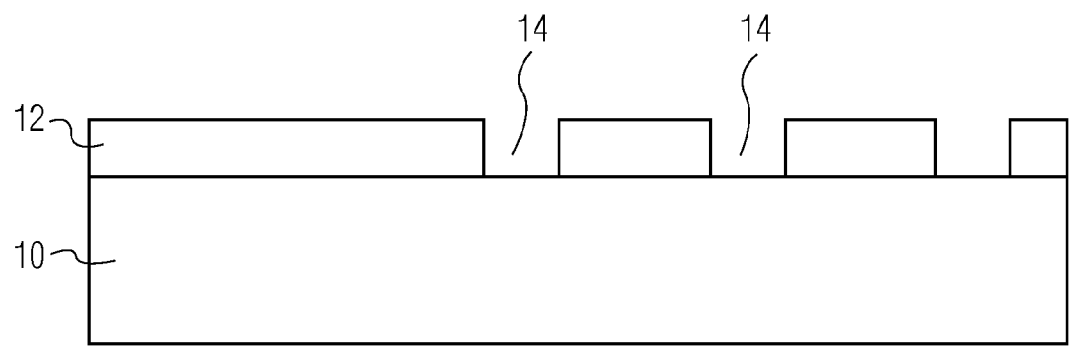
FIG. 1 shows a first stage in the process of an example of the method of the invention.

FIG. 1 shows a substrate 10 which can be in the form of a blanket silicon substrate or a silicon wafer with an integrated electric circuit including a back-end (metal connections and dielectric insulators). The invention is not limited to using a silicon substrate. Any flat surface that allows electrical connections and is compatible with the described process steps can be used. A dielectric layer 12 is deposited, for example silicon dioxide or silicon nitride. Trenches 14 are etched by photolithography in the layer 12 down to the silicon substrate 10 or even into the substrate down to a metal contact layer of the underlying integrated circuit. The trenches 14 can for example have either a striped layout or a ring layout.

Figure 2A:
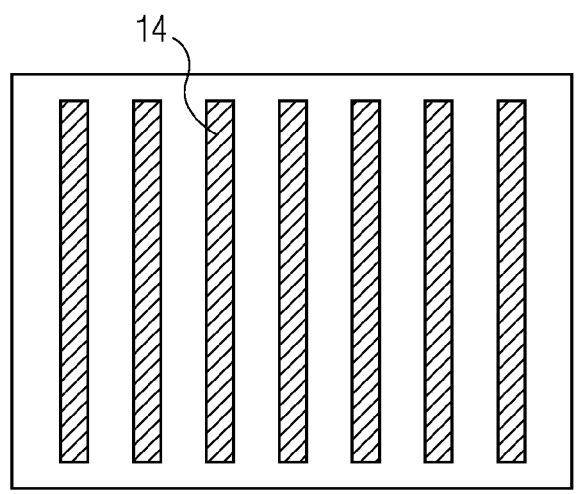
FIG. 2A shows a first possible layout for the anode structures.
Figure 2B:
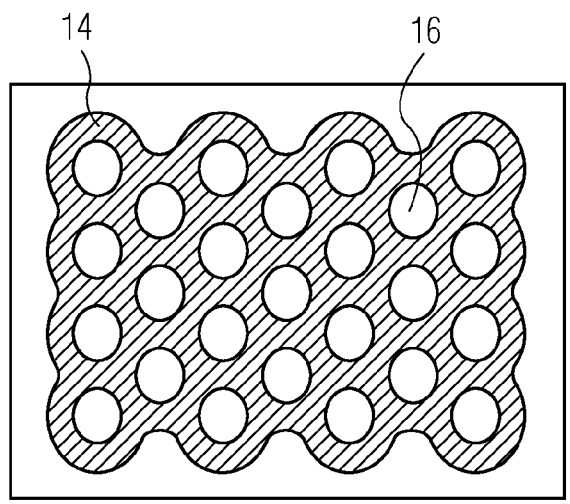
FIG. 2B shows a second possible layout for the anode structures.

FIG. 2 shows two possible trench patterns in plan view. In FIG. 2a, the trenches are parallel stripes, and in FIG. 2b they form interlinked rings, which thus define an array of circular non-etched columns 16. Other layouts can be considered such as a square, hexagonal or triangular layout.

Figure 3:
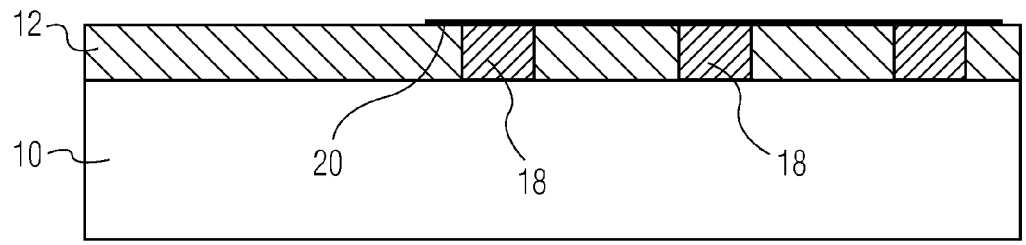
FIG. 3 is one example of a second stage in the process.

After creating the trenches, a conductive interconnect layer 18 is formed, for example a Ti/TiN/W stack, as shown in FIG. 3. The stack is deposited and anisotropically etched back or machined back using chemical mechanical polishing down to the dielectric layer 12, to fill the trenches.

Other possible stacks are tantalum nitride, tantalum and copper, or a stack of titanium tungsten alloy and tungsten. Materials are selected that are resistant to the sacrificial etch chemistry: HF or vapour HF. Thus, the materials which are suitable depend on the etch chemistry being used.

A relatively thin cathode metal 20 is then deposited and structured. For example, the cathode metal can be a titanium tungsten alloy, which is resistant to the sacrificial etch chemistry (HF or vapour HF). It can be the same stack as used for the pillars but preferably a total stack/layer thickness of 10-50 nm.

At this stage, the structure is as shown in FIG. 3.

The trenches filled with the conductive interconnects 18 form contacts from the highly doped substrate 10 to the cathode layer 20. The cathode layer 20 can also be extended beyond the active area (the active area being the area above the trenches) to form a top contact instead of using the underlying substrate as a contact. In this case, the trenches 18 are not needed.

This metal layer 20 functions as the field emitter cathode. Hence a low-work function is desirable and a well-controlled, clean surface is required.

Figure 4:
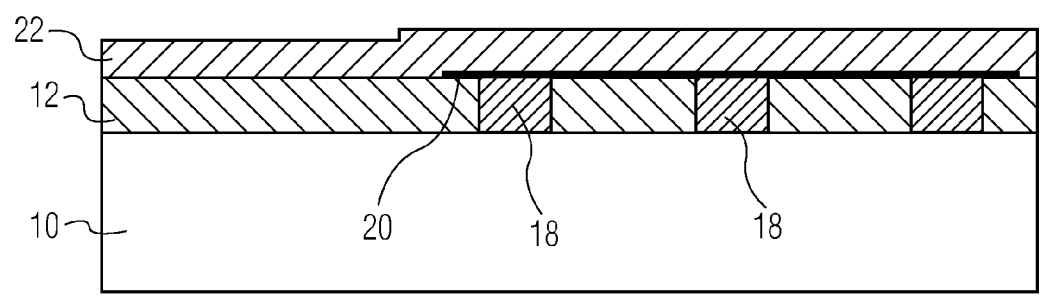
FIG. 4 is one example of a third stage in the process.

As shown in FIG. 4, a sacrificial dielectric layer 22 (a second dielectric layer) is then deposited, preferably made of the same material as the first dielectric layer 12. Both layers 12,22 have then the same chemical etch rate during the sacrificial etch later in the process which makes the sacrificial etch better controllable and easier to remove etch products.

The next step is to etch trenches/holes in the sacrificial layer 22, through the cathode metal layer 20, into the first dielectric layer 12.

If the striped layout is used, trenches are etched in the material between the trenches 18 and if the ring layout is used holes are etched into the regions 16 defined by the ring pattern (shown in FIG. 2b). Preferably, these trenches/holes are not etched all the way down to the substrate 10 since a sufficiently thick isolating layer (e.g. 300 nm) is preferred between the trench/hole bottom and the substrate 10 to avoid local breakdown between the anode metal and the substrate which acts as cathode contact, as well as to define a desired capacitance.

Subsequently, another sacrificial layer 24 (a third dielectric layer) is deposited, which defines the anode-cathode distance. This thickness can be tuned to achieve the desired trigger voltage of the ESD device.

The thickness typically will be 10-200 nm, more preferably between 20-50 nm depending on the thickness of the projecting layer 20, the work function of the cathode and the desired trigger voltage.

Preferably, the dielectric layer 24 is made of the same material as the first and second dielectric layers 12, 22. All layers have then the same chemical etch rate during the sacrificial etch later in the process which makes the sacrificial etch better controllable.

Figure 5:
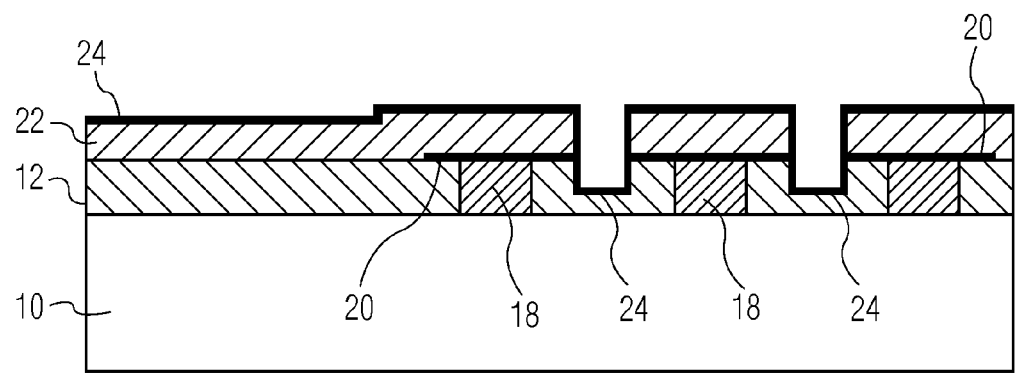
FIG. 5 is one example of a fourth stage in the process.

The resulting structure is shown in FIG. 5.

Figure 6:
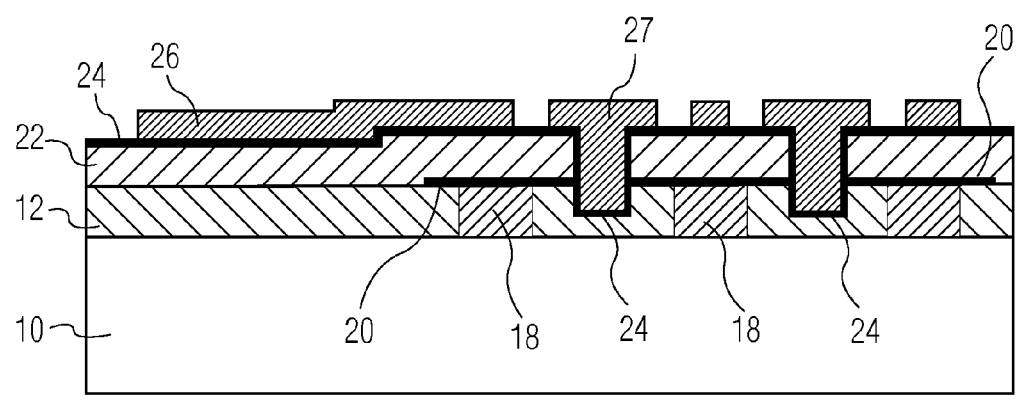
FIG. 6 is one example of a fifth stage in the process.

Next is the deposition of the anode metal layer 26 as shown in FIG. 6. This fills the trenches/holes to form anode pillars 27 as well as providing a top contact layer.

This layer is structured to create narrow (e.g. 1 μm diameter) trenches for the striped layout or small holes for the ring structure, to be able to etch the three dielectric layers, which all function as sacrificial layers, later in the process. In the example shown, this etching also creates an anode contact 28 outside the active area The anode contact can be used in order to connect bondwires to the anode without putting too much force on the weaker active area, which is under-etched during the sacrificial etch. This is shown in FIG. 7. However, this lateral contact is optional and as explained below, if a metal capping layer is used, it can be the contact.

The anode pillars can be formed from the same metal stacks as for the connection pillars 18.

A dielectric layer 30 is then deposited and structured to protect the dielectric layers outside the active area, against the sacrificial etch chemistry.

The three dielectric layers 12,22,24 are then isotropically etched in the active area as shown in FIG. 8, and the thin cathode layer 20 is partly released. A relatively sharp suspended cathode rim is created which is beneficial to achieve electric field enhancement between the cathode and anode.

It is preferred to keep some remains of the first dielectric layer 12 and third dielectric layer 24 underneath the anode pillars in order to give the device more mechanical strength and a better thermal conductance to the substrate.

Finally, a capping layer 32 is deposited and structured that can be either a dielectric layer (e.g. silicon nitride) or a metal layer (e.g. aluminium). In the case of a metal layer, it can also remain on top of the anode contact 28 outside the active area.

The capping step can also be replaced by wafer to wafer bonding techniques that are commonly used to create cavities.

The resulting lateral field emission ESD protection structure is shown in FIG. 9.

In this structure, there is a first dielectric layer 12 over a substrate 10 and connection pillars 18 extending through the first dielectric layer to the substrate (these are optional as mentioned above). The cathode layer 20 is over the first dielectric layer and defines cathode portions which have an edge region 34 with a portion of the first dielectric layer 12 beneath under-etched away thereby to define laterally projecting edge regions. Conductive anode pillars 27 extend into the first dielectric layer, and a lateral spacing is defined between each laterally projecting edge region and an adjacent anode pillar. A second dielectric layer 22 is over the cathode layer but is etched away over the edge regions so that the edge region forms a suspended projecting structure. The spacing corresponds to the thickness of the third dielectric layer 24.

The field emission in the device happens in lateral direction. Known lateral field emission devices have the advantage that emitter tips can be defined by lithography. However, the electrode gap is not well defined in lateral devices.

The process of the invention makes use of a spacer technique to define the electrode distance. This allows thin, well controlled gaps.

The device has a mechanically strong cavity where the anode/cathode electrode distance is independent on the mechanical strength of the capping layer since the top electrode (anode) is mechanically connected to the substrate at many places by the anode pillars. If the top electrode is a free-hanging membrane, the mechanical strength of this electrode has an impact on the anode/cathode electrode distance and the electrical performance of the device.

Good thermal coupling of both cathode and anode electrodes to the substrate is an advantage to conduct the thermal energy of an ESD pulse into the substrate.

By making use of an on-wafer capping technique, a vacuum can be created inside the cavity that avoids arcing between the cathode and anode. Vacuum PVD/PECVD processes can be used for the capping process. Alternatively, the device can be used as an arc gap device.

Thick interconnects can be used to improve electrical conductance which is desirable for ESD protection devices.

To keep the parasitic capacitance low and the cavity mechanically strong, the area ratio between the cathode 20 and the anode pillars 27 should be as small as processing and lithography allow for (i.e. large anode pillars and small cathode areas between the anode pillars).

The example above is based on an ESD protection device. However, the invention relates more generally to devices which make use of an accurately sized electric field gap between an anode and a cathode. There are various devices where small gaps with locally enhanced electrical fields are used. Examples are field emission triodes, light or electron sensors, and some types of display.

Various modifications will be apparent to those skilled in the art.

The invention claimed is:

1. A method of forming an electric field gap structure, comprising:
   forming a first dielectric (12) layer over a substrate (10);
   forming a cathode layer (20) over the first dielectric layer (12);
   forming a second dielectric layer (22) over the cathode layer (20);
   etching anode channels through the second dielectric layer (22) and the cathode layer (20) and into the first dielectric layer (12);
   lining the resulting surface with a third dielectric layer (24);
   forming conductive anode pillars (27) in the anode channels;
   etching away the third dielectric layer (24) and the second dielectric layer (22) in the vicinity of the anode pillars (17), and at least partially etching away the first dielectric layer (12) in the vicinity of the anode pillars (17), thereby to leave a suspended portion (34) of the cathode layer (20) which defines a lateral gap to an adjacent anode pillar (17).

2. A method as claimed in claim 1, further comprising forming connection pillars (18) through the first dielectric layer (12) to the substrate (10), and wherein the cathode layer (20) is formed over the first dielectric layer (12) and the connection pillars (18).

3. A method as claimed in claim 2, wherein the lateral field emission ESD protection structure is formed over an integrated circuit, and wherein the connection pillars (18) connect to a metal layer within the integrated circuit.

4. A method as claimed in any preceding claim, further comprising forming a packaging layer (32) over the anode pillars.

5. A method as claimed in any preceding claim, wherein the first, second and third dielectric layers (12,22,24) each comprise silicon dioxide or silicon nitride and wherein the first, second and third dielectric layers are preferably formed of the same material.

6. A method as claimed in any preceding claim, wherein the connection pillars (18) comprise a stack of one or more of titanium, titanium nitride and tungsten.

7. A method as claimed in any preceding claim, wherein the anode channels extend only partially into the first dielectric layer (12).

8. A method as claimed in any preceding claim, wherein the thickness of third dielectric layer (24) is selected to correspond to the desired anode-cathode gap.

9. A method as claimed in any preceding claim, wherein the material of the anode pillars (17) is also used to form an anode contact (28) over the third dielectric layer outside the region where the anode pillars (17) are formed.

10. An electric field gap structure, comprising:
   a first dielectric layer (12) over a substrate (10);
   a cathode layer (20) over the first dielectric layer (12) which defines cathode portions which have an edge region with a portion of the first dielectric layer (12) beneath under-etched away thereby to define laterally projecting edge regions (34);
   conductive anode pillars (17) which extend into the first dielectric layer (12), wherein a lateral spacing is defined between each laterally projecting edge region and an adjacent anode pillar (17);
   a second dielectric layer (22) over the cathode layer (20), wherein the second dielectric layer is absent over the edge regions (34); and
   a third dielectric layer (24) over the second dielectric layer (22), wherein the thickness of the third dielectric layer (24) corresponds to the lateral spacing.

11. A structure as claimed in claim 10, further comprising a packaging layer (32) over the anode pillars.

12. A structure as claimed in claim 10 or 11, wherein the first, second and third dielectric layers (12,22,24) each comprise silicon dioxide or silicon nitride.

13. A structure as claimed in claim 10, 11 or 12, wherein the anode channels extend only partially into the first dielectric layer (12).

14. A structure as claimed in any one of claims 10 to 13, comprising an anode contact (28) over the third dielectric layer (24) outside the region where the anode pillars are formed and formed from the same material as the anode pillars.

15. A structure as claimed in one of claims 10 to 14, formed over an integrated circuit, further comprising connection pillars which extend from the cathode layer (20) through the first dielectric layer to a metal layer within the integrated circuit.

* * * * *